US011671198B2

(12) United States Patent
Galbraith et al.

(10) Patent No.: US 11,671,198 B2
(45) Date of Patent: Jun. 6, 2023

(54) PROCESSING PROBLEMATIC SIGNAL MODULATION PATTERNS AS ERASURES USING WIRELESS COMMUNICATION DEVICES

(71) Applicant: Western Digital Technologies, Inc., San Jose, CA (US)

(72) Inventors: Richard Leo Galbraith, Rochester, MN (US); Iouri Oboukhov, Rochester, MN (US); Jonas Andrew Goode, Lake Forest, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/474,345

(22) Filed: Sep. 14, 2021

(65) Prior Publication Data
US 2023/0085085 A1   Mar. 16, 2023

(51) Int. Cl.
H04L 1/00 (2006.01)
H03M 13/00 (2006.01)
H03M 13/11 (2006.01)
H03M 13/15 (2006.01)
H04W 28/04 (2009.01)

(52) U.S. Cl.
CPC ....... H04L 1/0041 (2013.01); H03M 13/1102 (2013.01); H03M 13/154 (2013.01); H03M 13/616 (2013.01); H04L 1/0061 (2013.01); H04W 28/04 (2013.01)

(58) Field of Classification Search
CPC ............... H04L 1/0041; H04L 1/0061; H03M 13/1102; H03M 13/154; H03M 13/616; H04W 28/04
See application file for complete search history.

(56) References Cited

U.S. PATENT DOCUMENTS 9,137,057 B2   9/2015  Eliaz
11,513,895 B1  11/2022 Oboukhov et al.
(Continued)

FOREIGN PATENT DOCUMENTS

EP    1 758 254       2/2007
KR    10-2008-0077992 8/2008

OTHER PUBLICATIONS

International Search Report and Written Opinion for International Application No. PCT/US2022/028239, dated Oct. 21, 2022, 9 pgs.

Primary Examiner — Thien Nguyen
(74) Attorney, Agent, or Firm — Patent Law Works LLP

(57) ABSTRACT

Methods and apparatus are provided for controlling wireless signal transmissions, wherein problematic symbol patterns are relocated to an erasure region of a data packet prior to erasure encoding and transmission. Relocating the problematic symbol patterns is done so that, when the resulting erasure codeword is punctured and transmitted, the problematic patterns are not transmitted. Yet, those patterns can be restored by the decoder at the receiving device using an erasure decoder in accordance with erasure decoding techniques, e.g., punctured low-density parity-check (LDPC) decoding techniques. In this manner, problematic symbol patterns that may be corrupting during transmission due to noise are removed (punctured) prior to transmission, then restored by the decoder during decoding.

24 Claims, 13 Drawing Sheets

(56) References Cited

U.S. PATENT DOCUMENTS

| | | |
|---|---|---|
| 2010/0218066 A1 | 8/2010 | Okamura et al. |
| 2013/0080861 A1 | 3/2013 | Vyetrenko et al. |
| 2014/0177551 A1 | 6/2014 | Teague et al. |
| 2020/0177208 A1* | 6/2020 | Litsyn ............... H03M 13/2948 |
| 2021/0067269 A1* | 3/2021 | Chen .................... H04L 1/0041 |

* cited by examiner

PROCESSING PROBLEMATIC SIGNAL MODULATION PATTERNS AS ERASURES USING WIRELESS COMMUNICATION DEVICES

FIELD

The disclosure relates, in some embodiments, to wireless communication devices. More specifically, but not exclusively, the disclosure relates to methods and apparatus for controlling wireless transmissions using erasure encoding with punctured codewords.

INTRODUCTION

Wireless communication devices often employ some form of error correction capable of detecting and correcting errors arising during wireless transmissions so as to compensate for signal noise or other issues. For example, prior to transmission of a data packet, redundancy symbols may be generated and appended to the data by the transmitting device, which are then processed by a receiving device to detect and correct errors in the data. Some forms of error correction exploit erasure encoding with punctured erasure codewords.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides a device for wireless communication that includes: a wireless signal transmitter; and a processor communicatively coupled to the transmitter. The processor is configured to: identify a pattern in a packet of data to be transmitted; relocate the pattern from an initial location to an erasure region of the packet to generate a modified packet; erasure encode the modified packet into an erasure codeword; and transmit the erasure codeword to a receiving device using the transmitter.

Another embodiment of the disclosure provides a method for use by a device for wireless communication. The method includes: identifying a pattern in a packet of data to be transmitted; relocating the pattern from an initial location to an erasure region of the packet to generate a modified packet; erasure encoding the modified packet into an erasure codeword; and transmitting the erasure codeword to a receiving device.

Yet another embodiment of the disclosure provides a device for wireless communication. The device includes: a wireless signal receiver; and a processor communicatively coupled to the receiver. The processor is configured to: receive an erasure codeword from a transmitting device using the receiver; erasure decode the erasure codeword to obtain a decoded packet of data that includes a relocated portion corresponding to a pattern within an original packet of data; determine an initial location within the original packet of data of the pattern; and relocate the pattern within the decoded data using the initial location to regenerate the original packet of data.

Another embodiment of the disclosure provides a method for use by a device for wireless communication. The method includes: receiving an erasure codeword from a transmitting device; erasure decoding the erasure codeword to obtain a decoded packet of data that includes a relocated portion corresponding to a pattern within an original packet of data; determining an initial location within the original packet of data of the pattern; and relocating the pattern within the decoded data using the initial location to regenerate the original packet of data.

DETAILED DESCRIPTION

Figure 1:
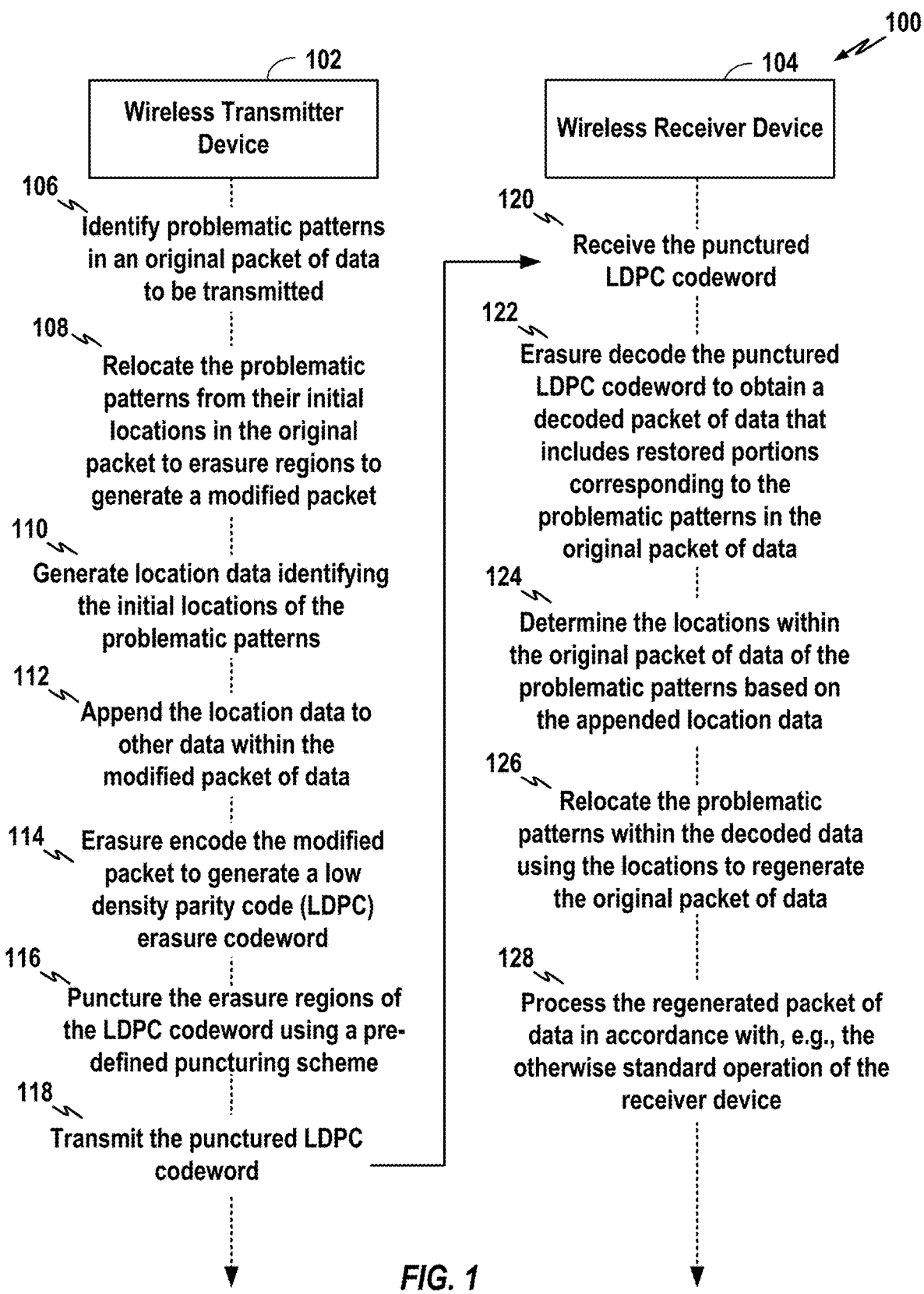
FIG. 1 illustrates an exemplary method for wireless communication that exploits erasure regions within an erasure codeword to encode problematic symbol or data patterns.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

An erasure code is a type of forward error correction code. Puncturing involves removing some parity bits (or other redundancy bits or symbols) from an encoded message after the message has been encoded with an error correction code, such as an erasure code. Puncturing in general can be applied to any symbols in a codeword (e.g., message or parity). For example, two overprotected circulant columns may be defined as message columns (e.g., columns associated with nodes of an H-matrix). To make the code have a wider range of code rate for rate matching applications (such as for use in 5G wireless communication applications), a combination of puncturing and code shortening may be performed. In some examples, a pre-defined deterministic puncturing pattern is employed by the encoder at the transmitting device. The decoder at the receiving device performs the inverse operation, also known as depuncturing, to recover the original message based on the pre-defined deterministic pattern.

One type of random/erasure code that may exploit puncturing is a low-density parity-check (LDPC) code, which is a form of linear error correcting code suited for transmitting messages over noisy communications channels, such as those that may arise in wireless communication. An LDPC code is often regarded as a random error correction code (where random error implies that both the location and magnitude of the error is unknown). LDPC often can be used in a limited erasure mode (with the erasure error implying the location is known but the magnitude is unknown). The erasure mode may be implemented by zeroing out received log-likelihood ratio (LLR) values of the symbols to be erased. The use of overprotected columns in the code is a technique to make the erasure mode more effective, but this method is often limited to one or two circulant columns of the code, and hence, in some aspects, it can be desirable to limit erasures to 3%-4% of the codeword symbols.

When transmitting data packets or other messages wirelessly from transmitter to receiver, the data may be transmitted as a series of symbols or symbol patterns in accordance with a digital modulation procedure, such as quadrature phase modulation (QAM). Within such modulation schemes, some symbol patterns are more likely to be adversely affected by noise than others, which may result in the transmitted symbol not being received. That is, problematic patterns are more likely to result in unintended erasures within a transmitted message than other non-problematic patterns. These symbols or symbol patterns are referred to herein as problematic symbols or symbol patterns. By way of example, symbols corresponding to corner points within a QAM symbol constellation (e.g., 16 QAM) may be subject to greater saturation or distortion than non-corner symbols and hence the corner symbols are problematic symbol patterns, whereas the non-corner symbols are non-problematic symbols patterns.

Herein, methods and apparatus are described wherein problematic symbol patterns within a data packet (or other message) to be encoded and transmitted are relocated to an erasure region of the data packet prior to transmission (e.g., relocated to a region of encoded data that will be punctured prior to transmission). Relocating the problematic symbol patterns prior to the encoding and transmission of the data packet is done so that, when the resulting erasure codeword is punctured and transmitted, the problematic patterns are not transmitted. Yet, those patterns can be restored by the decoder at the receiving device using its erasure decoder in accordance with erasure decoding techniques, e.g., punctured LDPC decoding techniques. In this manner, problematic symbol patterns that may be corrupting during transmission due to noise are removed (punctured) prior to transmission, then restored by the decoder during decoding along with other punctured data. In some examples, the transmitting device generates location data that identifies the locations of the problematic patterns within the original packet of data, and appends the location data to the erasure codeword so that the receiving device can use the location data to regenerate the original packet of data.

Thus, in an aspect of the present disclosure, a transmitter device for wireless communication is configured to identify a problematic pattern in a packet of data to be transmitted and then relocate the problematic pattern from an initial location to an erasure region of the packet to generate a modified packet. The transmitter device also generates location data specifying the original or initial location of the problematic pattern within the original data packet and appends the location data to other data within the modified packet (or otherwise inserts the location data into the modified packet). The transmitter device then erasure encodes the modified packet into an erasure codeword and transmits the erasure codeword to a receiving device. The receiving device receives the erasure codeword and erasure decodes the erasure codeword to obtain decoded data that includes restored portions that correspond to the problematic pattern within the original packet of data that had been punctured. (Note that the decoding/restoration process may also serve to restore some number of unintended symbol erasures resulting from noise or other corrupting factors. That is, the erasure decoding/restoration process restores both the intended punctures and some number of unintended erasures as well.) The receiving device determines the initial location within the original packet of data of the problematic pattern from the appended data, and uses the location to relocate the restored problematic pattern to its original location to thereby regenerate the original packet of data.

In some examples, punctured LDPC is used for coding and decoding but other puncturable erasure codes may be used, as appropriate. With LDPC, as will be explained below, an erasure region may be selected for puncturing that corresponds to overprotected nodes within an H-matrix of the LDPC code so that the problematic patterns can easily be restored during decoding.

Herein, the term "restore" is used primarily to refer to the erasure decoding procedure by which portions of a codeword that have been punctured or otherwise erased from the codeword are recreated during decoding based on redundancy bits. The term "regenerate" is primarily used herein to refer to the additional procedure by which the decoders described herein relocate the restored portions to their original locations within a data packet or other message to thus obtain a copy of the original data packet or message. Of course, other synonymous, equivalent, or otherwise suitable terms may be used to refer to either of these procedures, and so the particular terminology used herein is not limiting.

Although described primarily with reference to the relocation of problematic patterns, aspects of the methods and apparatus described herein are applicable to other patterns as well that might be relocated into an erasure region. Hence, the pattern to be relocated need not be a problematic pattern but can be some other pattern selected for another reason. That is, there may be one or more other reasons for relocating a pattern into the erasure region besides the pattern being problematic.

Some of the features described herein are also described in U.S. patent application Ser. No. 17/345,434, filed Jun. 11, 2021, titled "DATA STORAGE DEVICE PROCESSING PROBLEMATIC PATTERNS AS ERASURES," which is assigned to the assignee of the present application and fully incorporated by reference herein for all purposes.

ILLUSTRATIVE EXAMPLES

FIG. 1 illustrates an exemplary method 100 for wireless communication that may be performed by a wireless transmitter device 102 and a wireless receiver device 104. Beginning at 106, the transmitter device 102 identifies problematic patterns in an original packet of data to be transmitted (or other block of data or message). In some examples, this may be achieved by looking up predetermined information within a pre-stored table in the wireless transmitter device 102 that lists the problematic patterns for a particular modulation scheme to be used by the transmitter device 102. As noted above, problematic patterns may be, for example, symbols corresponding to corner points within a QAM symbol constellation (e.g., the corner symbols of 16 QAM). The table may store a list of each of the symbols in the constellation along with an indication of whether they are deemed problematic or not.

The initial determination of whether a particular symbol pattern is problematic within a particular modulation scheme for a particular wireless communication system may be obtained from previous engineering studies or from otherwise routine experimentation, with the problematic patterns identified in those studies or experiments stored in a table in the device for later lookup. Still further, in some aspects, a problematic pattern may be defined as a pattern having an average likelihood of transmission error that exceeds a predefined threshold. In some aspects, a problematic pattern is a pattern having an expected saturation level exceeding a saturation threshold or having an expected distortion level exceeding a distortion threshold. Appropriate values for the thresholds may be determined in advance based on the aforementioned studies or experiments. In some aspects, the thresholds may be quantified as a percentage deviation from some average or norm. In an illustrative example, a problematic pattern may be defined as a pattern that is X % more likely that an average pattern to suffer transmission problems, where X is, e.g., 20% or 30% or some other suitable value, which may depend on the particular communication system. In other examples, all corner symbols in a symbol constellation are deemed to be problematic, whereas non-corner symbols are deemed non-problematic. This may also depend on the particular communication system.

At 108, the transmitter device 102 relocates the problematic patterns from their initial locations in the original packet to erasure regions to generate a modified packet. At 110, the transmitter device 102 generates location data that memorializes, records or otherwise identifies the initial locations of the problematic patterns within the original packet. At 112, the transmitter device 102 appends the location data to other data within the modified packet of data (which may create a longer packet). At 114, the transmitter device 102 erasure encodes the modified packet to generate an LDPC erasure codeword in accordance with a predefined deterministic LDPC procedure that is programmed or hardwired into the transmitter device 102 (with the inverse LDPC procedure programmed or hardwired into the receiver device 104). LDPC codes belong to a class of binary systematic codes and are defined by a sparse parity check matrix H, an example of which is described below. At 116, the transmitter device 102 punctures the erasure regions of the LDPC codeword using a pre-defined deterministic puncturing scheme that is programmed or hardwired into the transmitter device 102 (with an inverse de-puncturing scheme programmed or hardwired into the receiver device 104). Other exemplary operations for use at 108-116 will be described in greater detail below. At 118, the transmitter device 102 transmits the punctured LDPC codeword.

At 120, the receiver device 104 receives the punctured codeword that had been transmitted by the transmitter device 102. (Note that the operations of the receiver device 104 in FIG. 1 beginning with 118 are performed after the operations of the transmitter device 102, although they are shown side by side in the figure for drawing convenience.) At 122, the receiver device 104 erasure decodes the punctured LDPC codeword (using the inverse of the procedures programmed or hardwired into the transmitter device 102) to decode and de-puncture the codeword to obtain a decoded packet of data that includes restored portions corresponding to the problematic patterns in the original packet of data. The decoded and de-punctured codeword also includes the appended location data. At 124, the receiver device 104 determines the locations within the original packet of data of the problematic patterns based on the appended location data. At 126, the receiver device 104 relocates the problematic patterns within the decoded data using the locations to regenerate (or re-create) the original packet of data originally processed by the transmitter device 102. At 128, the receiver device 104 processes the regenerated packet of data, which may be done, for example, in accordance with the otherwise standard operations of the receiver device. For example, the data in the packet may be combined with other packets of data received from the transmitter device 102 and then stored in memory, displayed on a graphic display of the receiver device 104, and/or relayed to another device.

Note that the receiver device 104 may be provided with components for erasure encoding and puncturing data for transmission (e.g., for performing operations 106-118) and the transmitter device 102 may be provided with components for erasure decoding and de-puncturing data following reception (e.g., for performing operations 120-128). That is, both devices may be transceiver devices equipped to encode/decode and transmit/receive data and other signals, as well as performing a wide variety of other functions that may depend on the particular type of device, such as wireless router functions if the device is a router.

Figure 2:
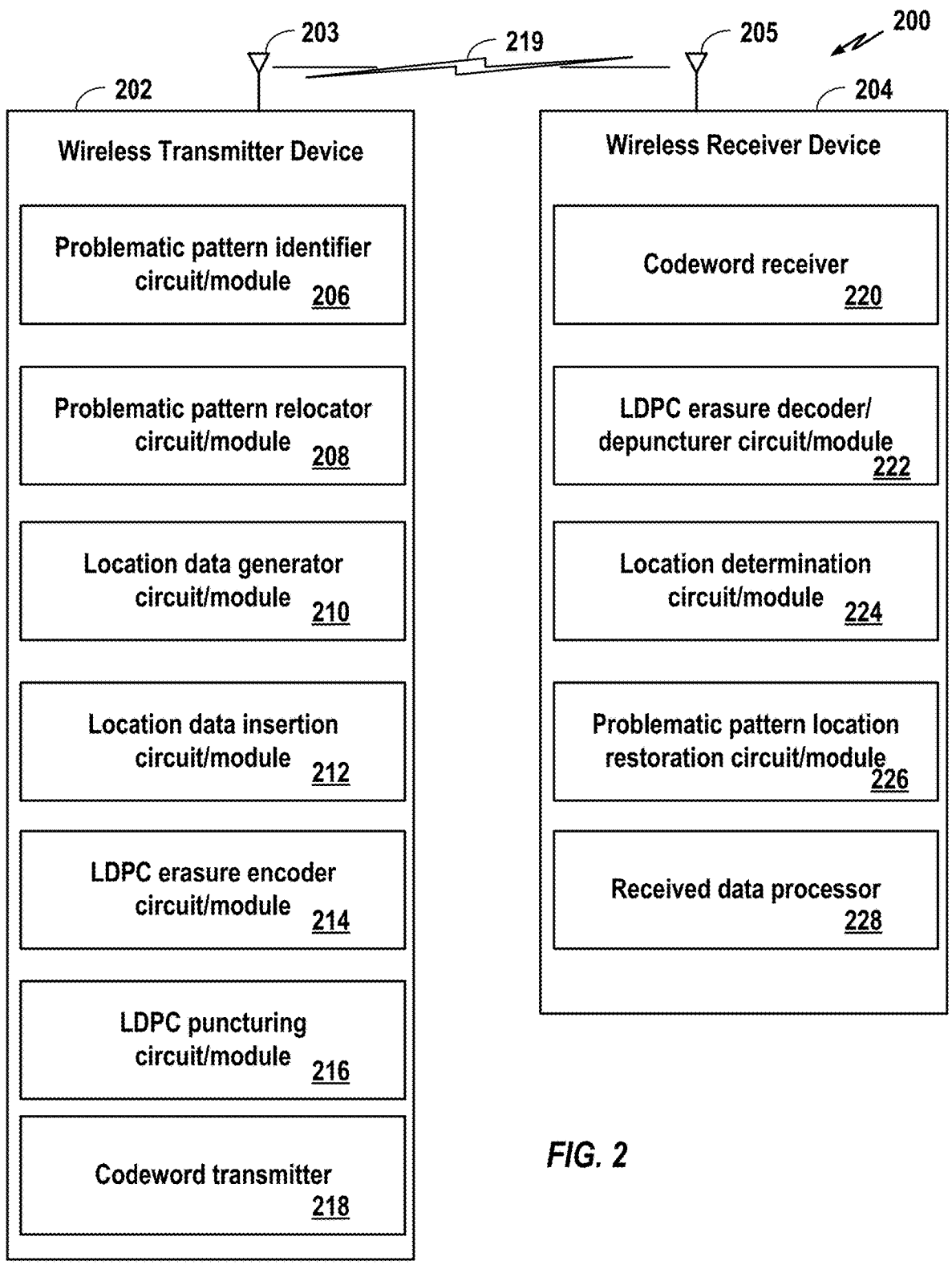
FIG. 2 illustrates an exemplary system for wireless communication that exploits erasure regions within an erasure codeword to encode problematic symbol or data patterns.

FIG. 2 illustrates an exemplary system 200 for wireless communication that includes a wireless transmitter device 202 with an antenna 203 and a wireless receiver device 204 with an antenna 205. The wireless transmitter device 202 includes circuits (e.g. hardware) and/or modules (e.g., firmware or software) configured to perform the various functions described above in FIG. 1 for wireless transmitter device 102. Likewise, the wireless receiver device 204 includes circuits and/or modules configured to perform the various functions described above in FIG. 1 for wireless receiver device 104.

The wireless transmitter device 202 includes a problematic pattern identifier circuit/module 206 configured to identify problematic patterns in an original packet of data to be transmitted (or other block of data or message). As explained above, this may be achieved by looking up predetermined information within a pre-stored table (not separately shown). A problematic pattern relocator circuit/module 208 is configured to relocate the problematic patterns from their initial locations in the original packet to erasure regions to generate a modified packet. A location data generator circuit/module 210 is configured to generate location data that memorializes, records or otherwise identifies the initial locations of the problematic patterns within the original packet. A location data insertion circuit/module 212 is configured to append the location data to other data within the modified packet of data (or otherwise insert the location data into the packet). An LDPC erasure encoder circuit/module 214 is configured to erasure encode the modified packet to generate an LDPC erasure codeword in accordance with a predefined deterministic LDPC procedure programmed or hardwired into the LDPC erasure encoder circuit/module 214. An LDPC puncturing circuit/module 216 is configured to puncture the erasure regions of the LDPC codeword using a pre-defined deterministic puncturing scheme programmed or hardwired into the LDPC puncturing circuit/module 216. A codeword transmitter 218 is configured to transmit the punctured LDPC codeword using antenna 203 over a signal path 219.

The wireless receiver device 204 includes a codeword receiver 220 configured to receive (via antenna 205) the punctured codeword transmitted by the transmitter device 202. An LDPC erasure decoder/de-puncturer circuit/module 222 is configured to erasure decode the punctured LDPC codeword (using the inverse of the LDPC procedures used by the transmitter device 202) to decode and de-puncture the codeword to obtain a decoded packet of data that includes restored portions corresponding to the problematic patterns in the original packet of data. The decoded and de-punctured codeword also includes the appended/inserted location data. A location determination circuit/module 224 is configured to determine the locations within the original packet of data of the problematic patterns based on the appended/inserted location data. A problematic patter location restoration circuit/module 226 is configured to relocate the problematic patterns within the decoded data using the locations to regenerate (or re-create) the original packet of data originally processed by the transmitter device 202. A received data processor 228 is configured to processes the regenerated packet of data, which may be done, for example, in accordance with the otherwise standard operation of the receiver device 204.

Note that the receiver device 204 may be provided with components for erasure encoding and puncturing data for transmission (e.g., components 206-118) and the transmitter device 202 may be provided with components for erasure decoding and de-puncturing data following reception (e.g., components 220-128). That is, both devices may be transceiver devices equipped to encode/decode and transmit/receive data and other signals or performing a wide variety of other functions that may depend on the particular type of device, such as performing wireless router functions if the device is a router. In general, though, the wireless device can be any device used in a wireless communication system, including wireless communication systems implementing any of 3G, 4G, or 5G standards or protocols.

Figure 3:
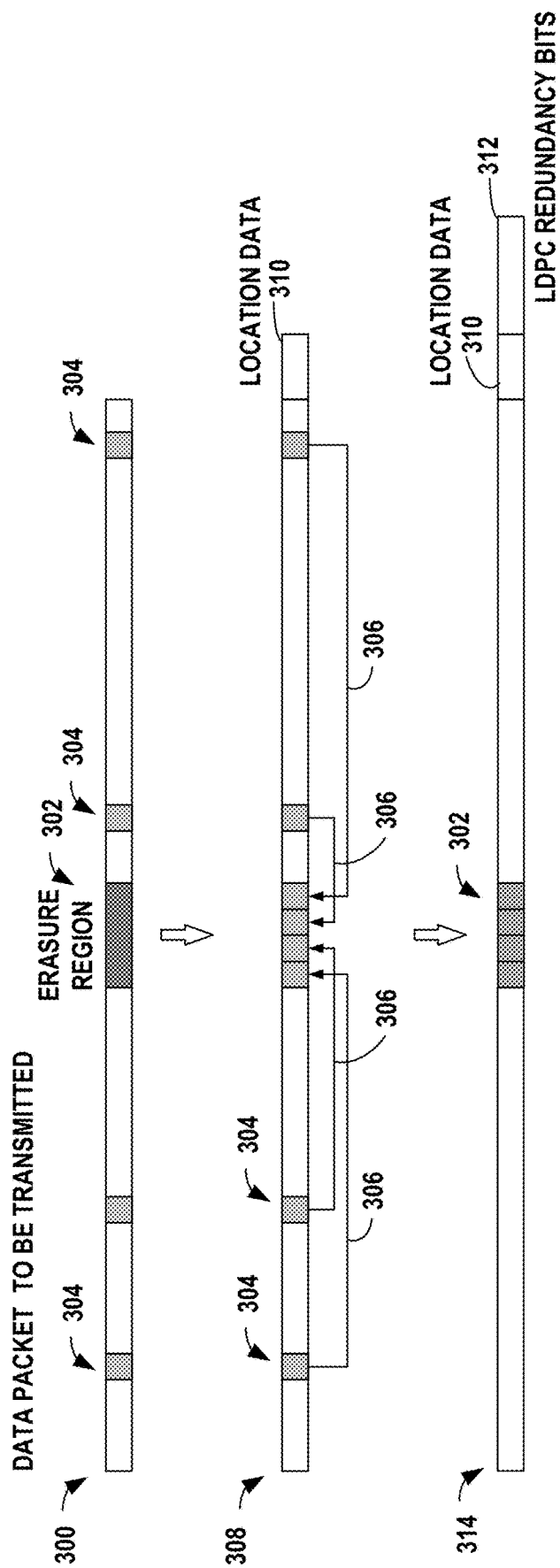
FIG. 3 illustrates an example of the relocation of problematic patterns.

FIG. 3 illustrates the relocation of problematic patterns for an embodiment with a single erasure region. The figure illustrates a data packet 300 (or other message or portion of data) that will be encoded into an erasure codeword based on a punctured LDPC code. An erasure region 302 (represented as a darkly shaded segment in the figure) of the data packet 300 will not be transmitted by the transmitting device but instead will be processed as erasures during the subsequent decoding process by the receiving device to restore the erased portion of the data. The data packet 300 includes some problematic patterns 304 (represented as lightly shaded segments). At least some of the problematic patterns 304 are moved or relocated to the erasure region as shown by arrows 306, resulting in a modified data packet 308. For example, the problematic patterns may be replaced with (e.g., swapped with) the corresponding patterns in the erasure region. In another example, the symbols in the erasure region may be "pushed up" or "pushed down" by shifting the symbols left or right within the data packet as part of the process for relocating the problematic patterns.

Location data 310 for the problematic patterns is generated to allow the receiver to relocate the problematic patterns to their initial locations after erasure decoding following reception. The location data 310 is appended, as shown, to the modified data packet 308 prior to encoding of the modified packet into the erasure codeword. LDPC parity bits or redundancy bits 312 are then generated over the entire modified data packet 308 to generate an erasure codeword 314 that includes the erasure region 302 that now stores the problematic patterns 304. (Note that the figure is not to scale.)

The erasure codeword 314 is then transmitted while omitting the erasure region 302, i.e. the erasure region 302 is punctured, and so the problematic patterns 304 are not transmitted. The wireless receiver decodes the received punctured LDPC codeword using the redundancy bits 312 to restore the problematic patterns 304 as well as to decode the location data 310. The decoded location data is then used to relocate the decoded problematic patterns to their initial locations in the data packet (i.e., the locations shown within the original packet 300). Although in FIG. 3 the erasure region 302 is shown as a contiguous segment, in some examples, the erasure region may be distributed in the codeword. Moreover, multiple erasure regions may be employed, i.e., more than one portion of the codeword may be punctured.

Figure 4:
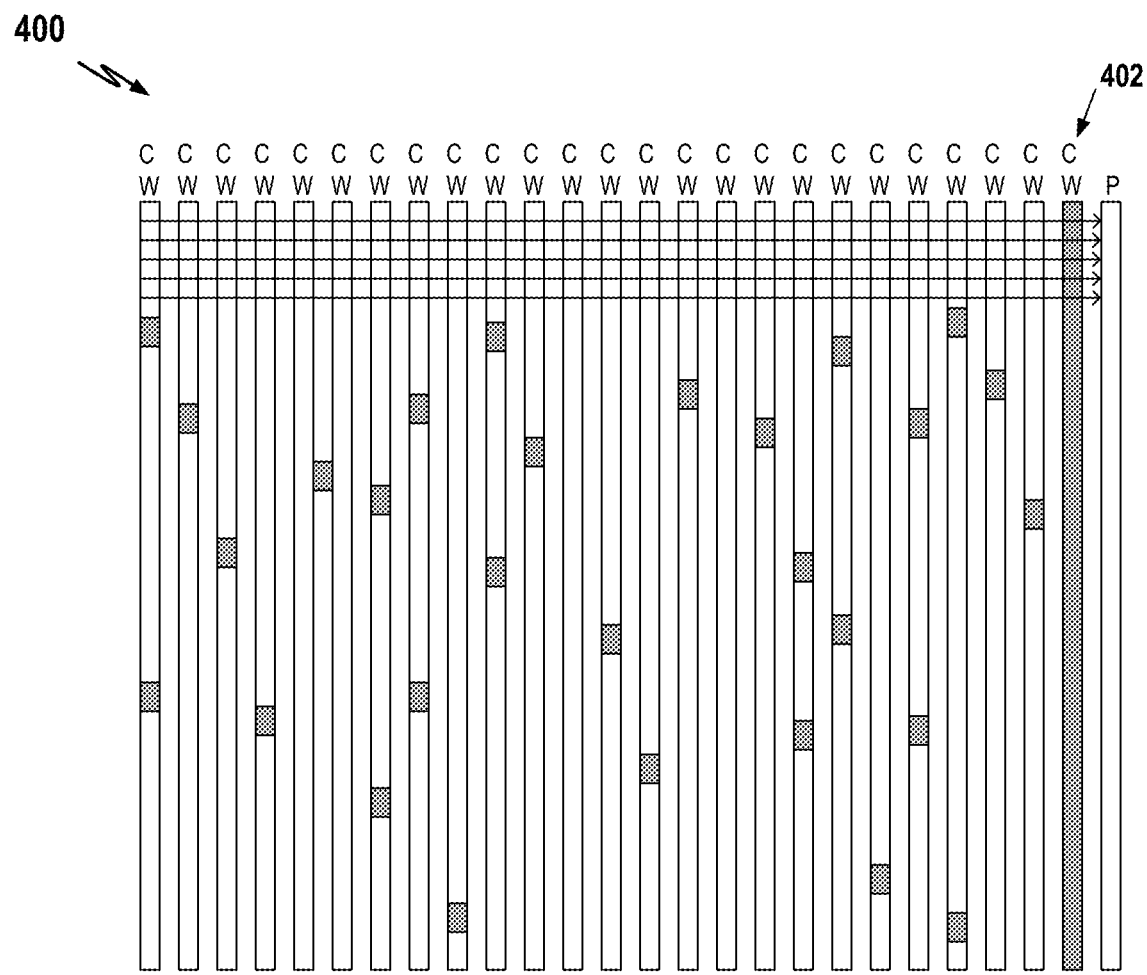
FIG. 4 illustrates an example where the erasure codeword may be a parity block codeword generated over a plurality of sub-block codewords.

FIG. 4 illustrates an embodiment where the erasure codeword may be a parity block codeword generated over a plurality of sub-block codewords. The figure illustrates a parity block codeword 400 wherein a parity block (P) is generated over a plurality of sub-block codewords (CW). When decoding the parity block codeword, the parity block (P) is used to recover one or more of the sub-block CWs that are unrecoverable at the sub-block level. For example, each sub-block CW may be a conventional LDPC codeword that is decoded using an iterative decoder. If the iterative decoder fails to decode the LDPC codeword, the parity block (P) may be processed to help recover the LDPC codeword.

As further shown in FIG. 4, at least one sub-block CW of a parity block codeword is designated as an erasure region CW 402. Problematic patterns (shown as shaded segments in figure) are moved to the erasure region CW 402 prior to encoding the sub-block codewords and the parity block codeword. For example, the erasure region CW 402 may initially store data which may be swapped with problematic patterns identified in other sub-block codewords similar to the embodiment described above with reference to FIG. 3. That is, a parity block CW may be rearranged so that one of the sub-block codewords (e.g., CW 402) is used to store at least some of the problematic patterns identified across all of the sub-block codewords.

In another embodiment, the erasure region CW 402 may be empty initially and then filled with the problematic patterns identified in the other sub-block codewords. In one embodiment, the problematic patterns shown in FIG. 4 may be replaced with assistive patterns known to improve the SNR during signal transmission/reception. The assistive patterns may improve the probability of recovering the sub-block codewords at the sub-block level (e.g., recovering an LDPC codeword at the sub-block level). In one embodiment, the erasure region CW 402 is not transmitted but is instead restored during a decode operation using the other decoded sub-block CWs and the parity block (P). In this regard, replacing the problematic patterns in the sub-block CWs with assistive patterns may help recover the sub-block codewords at the sub-block level, which may then be used together with the parity block (P) to decode the erasure region CW 402 and thereby restore/regenerate the problematic patterns. Location data may then be used to replace the assistive patterns in the sub-block CWs with the corresponding problematic patterns to regenerate the input data.

In one embodiment, the location data may be added to the erasure region CW 402 prior to encoding the parity block codeword and then restored/regenerated together with the problematic patterns when decoding the erasure region CW 402. In one embodiment, the erasure region CW 402 may be transmitted and decoded at the sub-block level during a decode operation in order to assist in the overall decoding of the parity block codeword. In an embodiment where the problematic patterns in a sub-block codeword are replaced with assistive patterns as described above, the assistive patterns may consist of a sequence not seen in the normal data to be transmitted. An example of a sequence not seen in normal data is a sync mark used to symbol synchronize a sub-block codeword. Accordingly in this embodiment, when an assistive pattern is detected in a sub-block codeword during decoding of the erasure codeword, the assistive pattern is replaced with the corresponding problematic pattern (e.g., located in the erasure region). Also in this embodiment, it may not be necessary to transmit location data for the problematic patterns since the location of the assistive pattern within the sub-block codeword becomes the location data for the problematic pattern. That is, when an assistive pattern is detected in a sub-block codeword during decoding of the erasure codeword, the assistive pattern is replaced with the next problematic pattern when the problematic patterns are stored in a consecutive order (e.g., in the erasure region).

In the example of FIG. 4, the parity block codeword is a single parity block (P) generated over multiple sub-block codewords (e.g., LDPC codewords), whereas other embodiments may employ multiple parity blocks generated, for example, over different interleaves of multiple sub-block codewords. That is, other embodiments may employ any suitable two-dimensional encoding scheme to encode a plurality of sub-block codewords into any suitable erasure codeword. In yet other embodiments, additional erasure coding may be employed (e.g., a super-block codeword generated over multiple erasure codewords) in order to recover one or more sub-block codewords unrecoverable at the sub-block level (e.g., due to strong noise during transmission).

Figure 5:
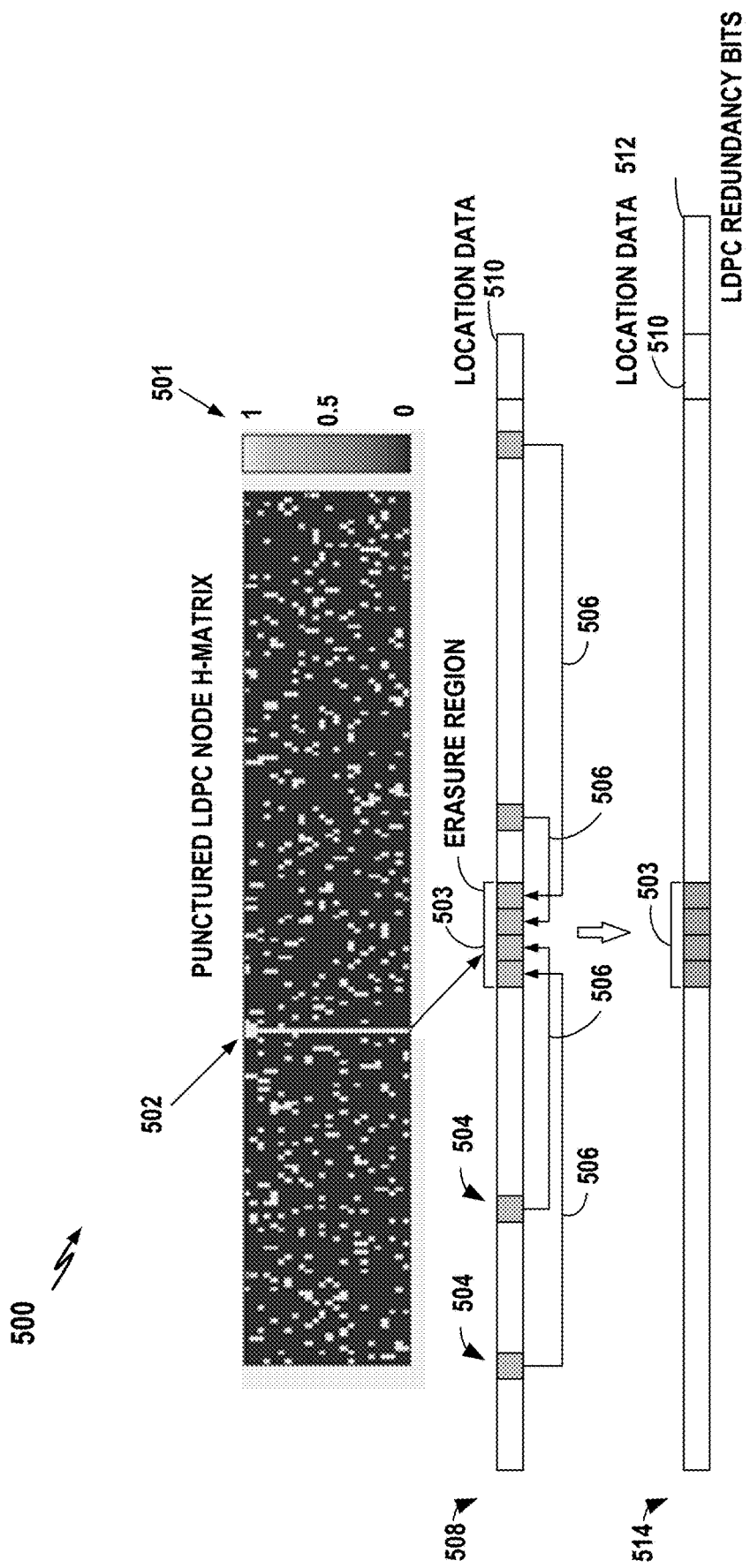
FIG. 5 illustrates a punctured LDPC node matrix H.

FIG. 5 illustrates a punctured LDPC node matrix H (or h) 500, which represents the row and column weight of LDPC code, with stronger weights represented by lighter shades and weaker weights represented by darker shades. A legend 501 illustrates the relative weights corresponding to the gradation of the shades, with the lightest shade (white) having a weight of 1 and the darkest shade (black) having a weight of 0. (In the particular example of FIG. 5, the shades are mostly either dark or light, with few, if any, intermediate shades. In other examples, there may be a greater number of intermediate weight values.) Generally speaking, a row weight represents how many data points participate in each parity check equation and a column weight represents how many parity equations participate in each data point. In some examples, there are a total of 4500 parity check equations per 4 kilobyte (KB) codeword.

Typically, in punctured code, some data is protected by a high column weight. This is represented by the vertical line of nodes 502, which, as shown, each have very light shades and hence strong weights. In this example, data corresponding to the vertical line or column of nodes 502 will be overprotected by the LDPC code because the data participates in a large number of parity check equations, e.g., twenty-five parity check equations. Hence, the data will be decoded even if not transmitted and instead treated as an erasure. Generally speaking, punctured LDPC code does not care what data is punctured. The location of the puncturing is fixed by the LDPC matrix. With a large amount of different codewords, the punctured data could be any possible data—unless problematic patterns are relocated into the erasure region using the techniques described herein.

FIG. 5 also illustrates a data packet (or other message or block of data) 508 to be encoded that includes an erasure region (or puncturing zone) 503 corresponding to the overprotected vertical line or column of nodes 502. Similar to the example of FIG. 3, some portions of the data packet are problematic patterns 504 that are relocated into the erasure region 503 as shown by arrows 506, with location-identifying data 510 appended to the end of the data packet. FIG. 5 also illustrates a resulting codeword 514 showing the location data 510 and the resulting redundancy bits 512. Note that the location data can be compressed.

In one example, the encoder in the transmitter selects twelve symbols within the data packet that have the worst patterns, i.e., the most problematic symbol patterns, and the encoder moves those twelve symbols into the erasure zone 503. To memorize the initial location of the problematic symbols, the location data 510 is generated and appended. (The location data may be, e.g., some sequence of bits that represents the location of a particular symbol relative the beginning of the data packet.) The modified packet is then encoded by LDPC into a codeword and, as already explained, the erasure portion 503 is punctured and the remaining symbols/bits are transmitted. A decoder in the receiving device decodes the codeword and restores the erased problematic symbols. Note that the relative advantage of this modulation code or scheme (as compared to scheme that does not relocate problematic symbols) may depend on the code penalty associated with the amount of position encoding needed to encode the locations of the problematic patterns. Hence, compression of the position/location encoding bits can be used to reduce that penalty.

Figure 6:
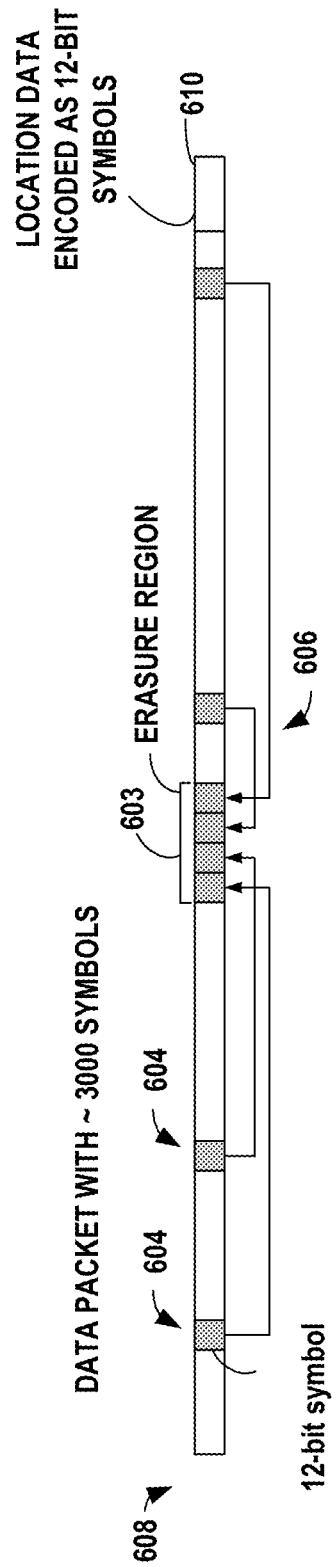
FIG. 6 illustrates an exemplary embodiment where all bits in a data packet are divided on 12-bit symbols.

FIG. 6 illustrates an embodiment wherein all bits in a data packet (e.g., user bits) 600 are divided on 12-bit symbols (i.e., each symbol is represented by 12 bits as may be needed in some QAM symbol constellations). Hence, there are about ~3000 symbols if the data packet is a 4 kilobyte (4 kB) data packet. The initial positions of each problematic symbol 604 can be encoded by a 12-bit symbol (and appended within location data portion 610) such that there is a redundancy that is equivalent to the punctured region: 12-bit encoding, for each 12-bit symbol. As shown by arrows 606, the problematic 12-bit symbols are relocated into the erasure region 603, which also accommodates 12-bit symbols.

Figure 7:
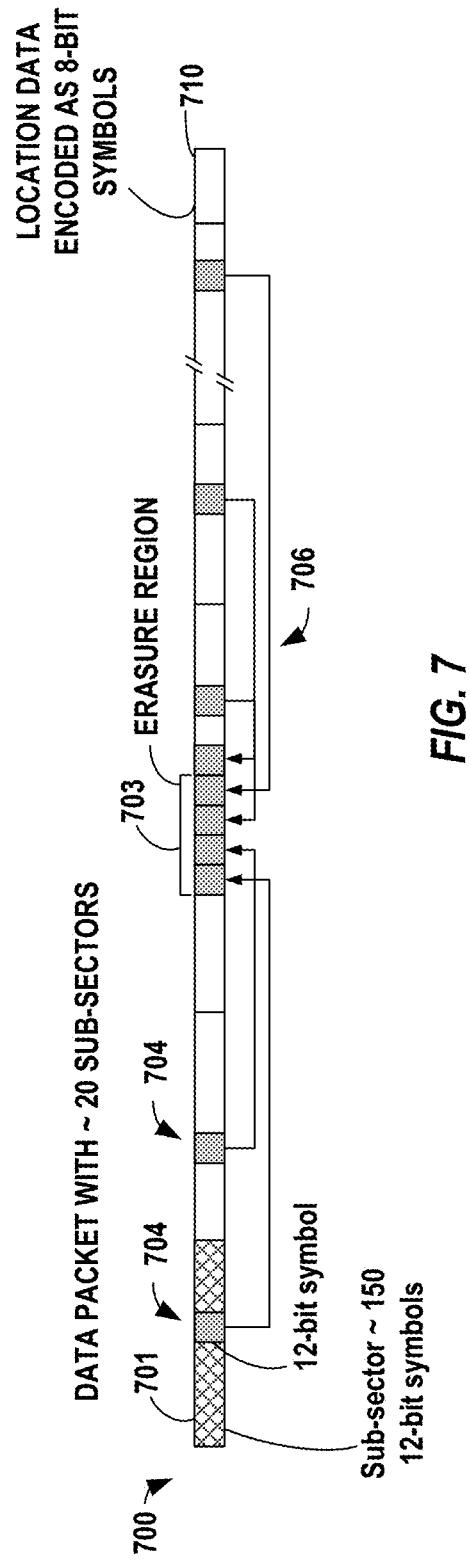
FIG. 7 illustrates an exemplary embodiment where all bits in a data packet are divided on 12-bit symbols within twenty sub-sectors.

FIG. 7 illustrates an embodiment wherein all bits in a data packet (e.g. user bits) 700 are again divided on 12-bit symbols but the symbols are within 20 sub-sectors 701, one of which is represented by cross-hatching in the figure. Each subsector contains ~150 12-bit symbols. The initial positions of problematic symbols 704 are shown. As shown by arrows 706, the problematic symbols are relocated into the erasure region 703. The encoder chooses problematic patterns subject to the condition that there is one 12-bit problematic symbol in each subsector. In this case, to encode the initial location of a problematic symbol, the encoder uses only 8 bits. As such, the encoding redundancy can be smaller and the code more efficient than the embodiment of FIG. 6.

Figure 8:
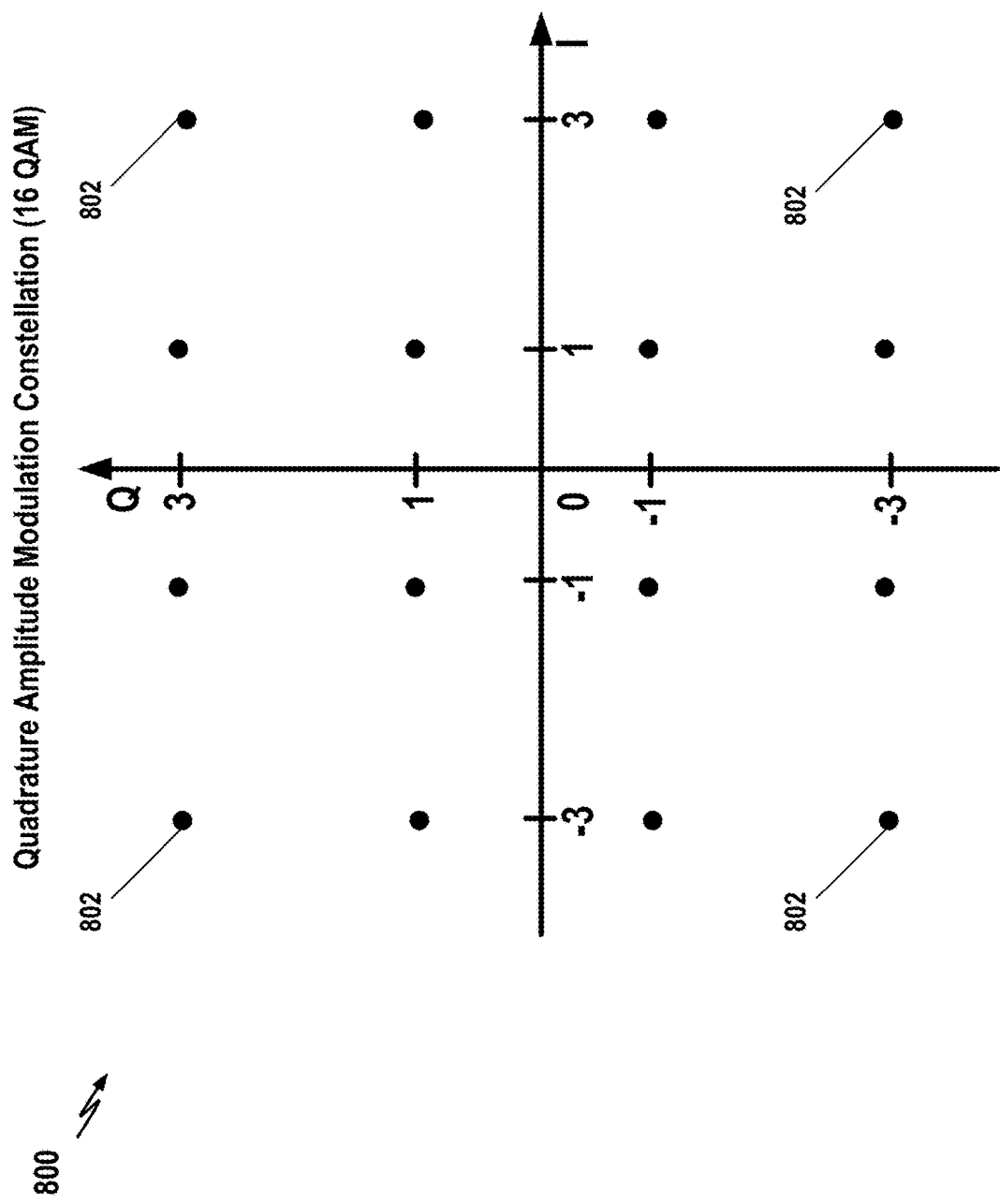
FIG. 8 illustrates a 16-QAM constellation map, particularly illustrating corner symbols that represent problematic patterns.

FIG. 8 illustrates a 16 QAM constellation map 800. As noted above, corner symbols in the constellation (denoted 802 in the figure) are problematic symbols since they can be subject to more saturation or distortion when transmitted.

Hence, for a wireless system that uses 16-QAM, the four corner symbols may be designated as the problematic symbols and relocated, as already explained. For other modulation schemes, a different set of symbols may be problematic. For 64 QAM and 128 QAM, which have much larger constellations, more symbols may be problematic but they represent a smaller percentage of the total number of symbols. A modulation scheme having 3-4% of its symbols as problematic symbols is particularly well-suited to the techniques described herein. As explained above, the initial determination of whether a particular symbol in a particular modulation scheme is problematic for a particular wireless communication system may be obtained from engineering studies or from otherwise routine experimentation.

Among other features, at least some of the methods and apparatus described herein advantageously and jointly use modulation coding and punctured parity LDPC. Punctured information correspond to problematic patterns is not transmitted as it is generally better to not transmit problematic patterns as opposed to good patterns. In some examples, the modulation code uses LDPC punctured code erasure to hide symbols with problematic patterns. In some examples, the symbol original position/location encoding can be compressed to improve code efficiency. Note also that wireless communication is often generally insensitive to code rate and so code rate penalties should be modest.

In the following, various general exemplary procedures and devices are described.

Additional Embodiments

Figure 9:
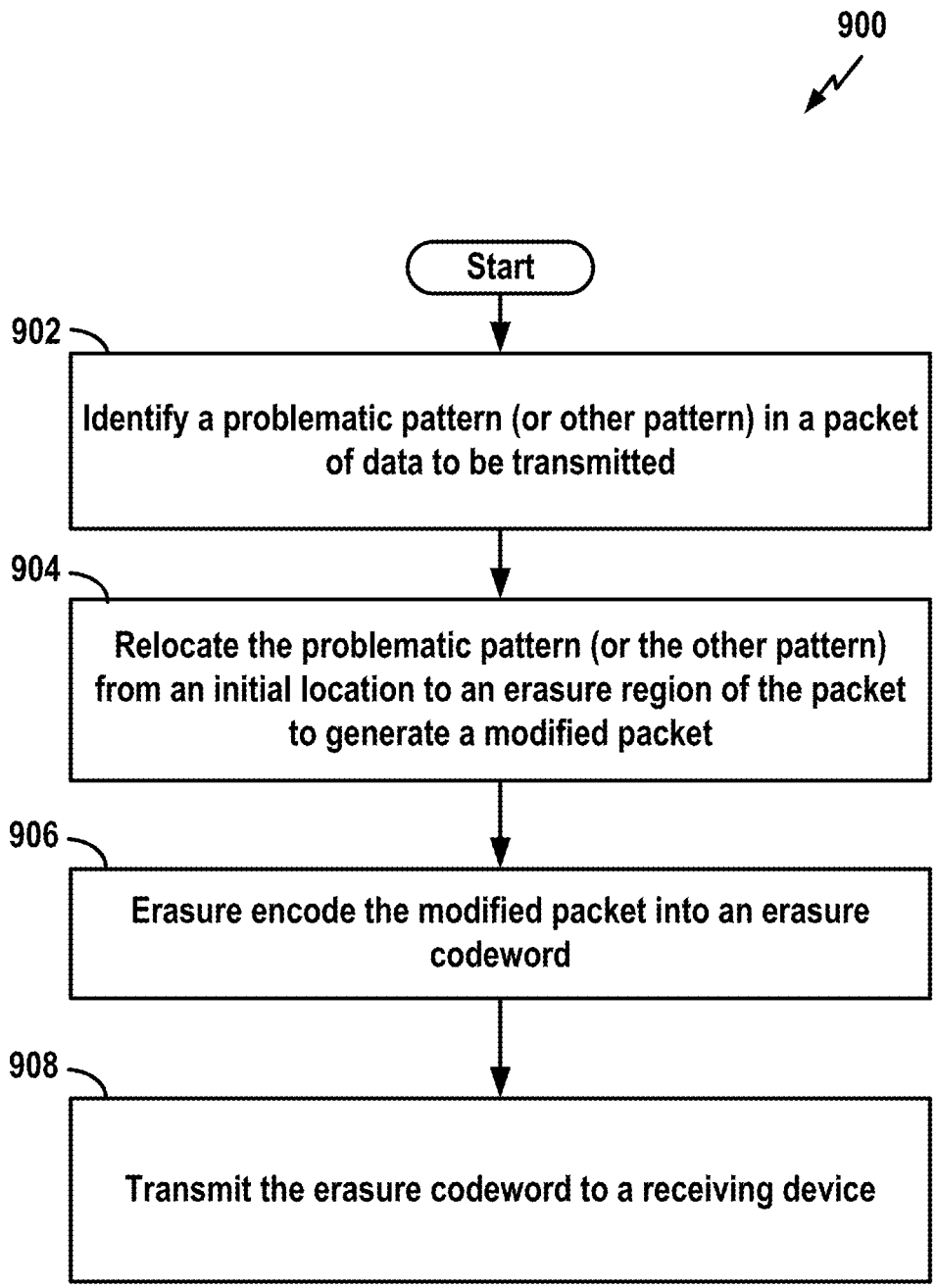
FIG. 9 illustrates an exemplary method that may be performed by a transmitting device for wireless communication.

FIG. 9 illustrates a method 900 according to an aspect of the present methodology that may be performed by a transmitting device for wireless communication. Briefly, at 902, the transmitting device identifies a problematic pattern (or other selected pattern) in a packet of data to be transmitted. At 904, the transmitting device relocates the problematic pattern (or the other selected pattern) from an initial location to an erasure region of the packet to generate a modified packet. At 906, the transmitting device erasure encodes the modified packet into an erasure codeword. At 908, the transmitting device transmits the erasure codeword to a receiving device. Detailed examples of these operations are described above.

Figure 10:
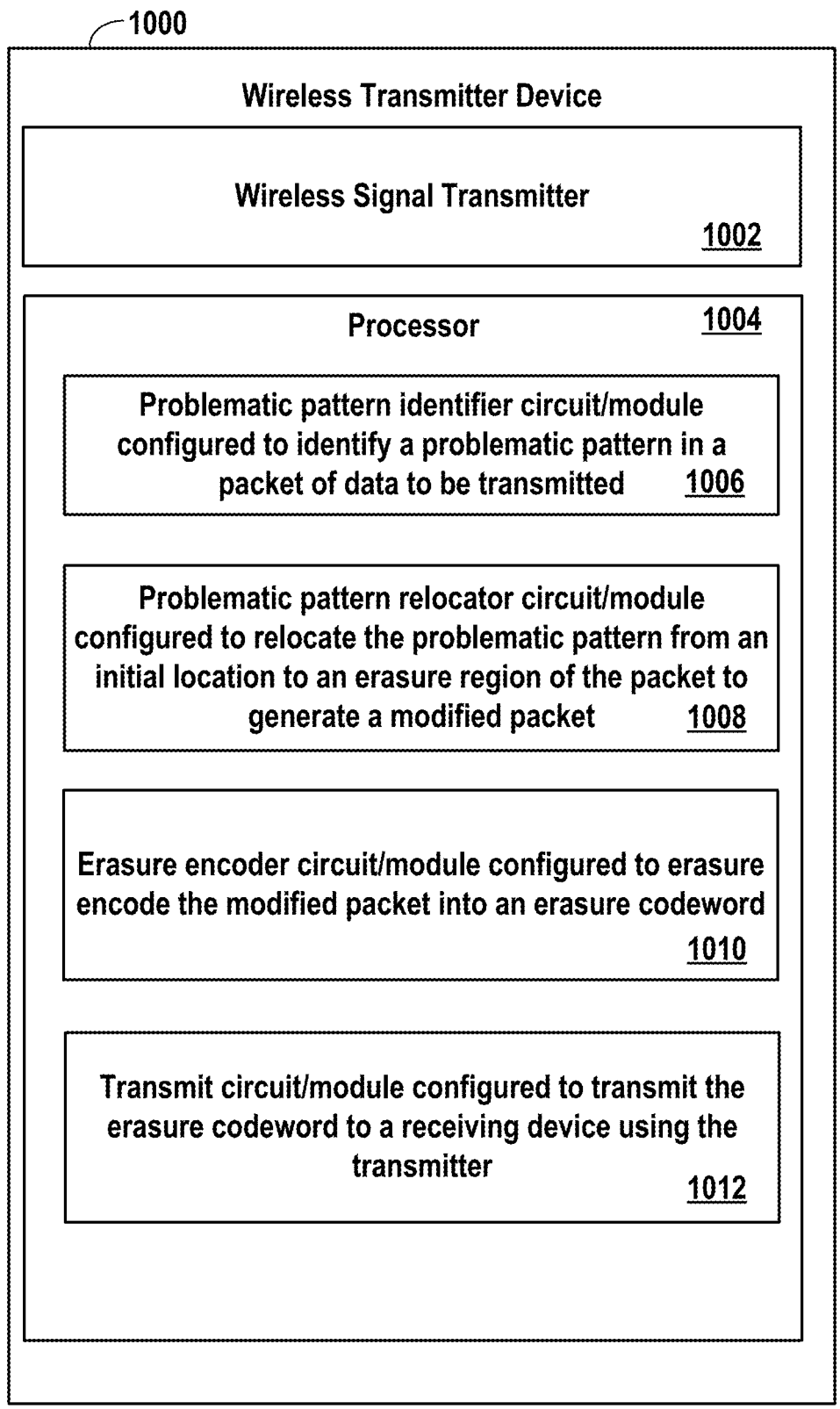
FIG. 10 illustrates selected components of an exemplary wireless transmitter device for use in wireless communication.

FIG. 10 illustrates selected components of a wireless transmitter device 1000 for use in wireless communication. The transmitter device 1000 includes a wireless signal transmitter 1002 and a processor 1004 that is communicatively coupled to the transmitter 1002. The processor 1004 includes: a problematic pattern identifier circuit/module 1006 configured to identify a problematic pattern (or other selected pattern) in a packet of data to be transmitted; a problematic pattern relocator circuit/module 1008 configured to relocate the problematic pattern (or the other selected pattern) from an initial location to an erasure region of the packet to generate a modified packet; erasure encoder circuit/module 1010 configured to erasure encode the modified packet into an erasure codeword; and a transmit circuit/module 1012 configured to transmit the erasure codeword to a receiving device using the transmitter 1002. Additional or alternative components may be provided.

The problematic pattern identifier circuit/module 1006 provides means for identifying a problematic pattern (or other selected pattern) in a packet of data to be transmitted. The problematic pattern relocator circuit/module 1008 provides means for relocating the problematic pattern (or the other selected pattern) from an initial location to an erasure region of the packet to generate a modified packet. The erasure encoder circuit/module 1010 provides means for erasure encoding the modified packet into an erasure codeword. The transmit circuit/module 1012 provides means for transmitting the erasure codeword to a receiving device using a wireless signal transmitter.

Figure 11:
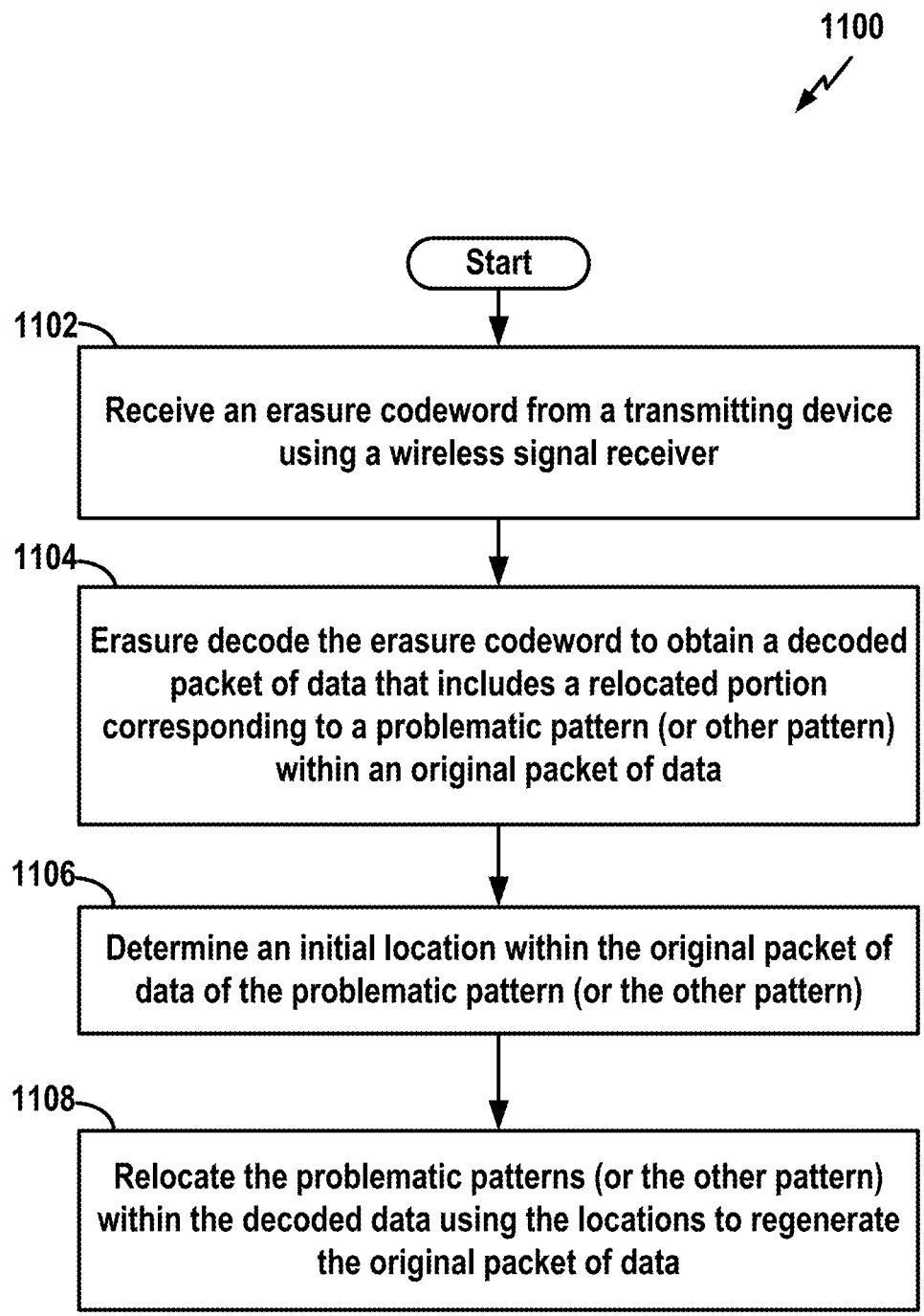
FIG. 11 illustrates an exemplary method that may be performed by a receiving device for wireless communication.

FIG. 11 illustrates a method 1100 according to an aspect of the present methodology that may be performed by a receiving device for wireless communication. Briefly, at 1102, the receiving device receives an erasure codeword from a transmitting device using the transceiver. At 1104, the receiving device erasure decodes the erasure codeword to obtain a decoded packet of data that includes a relocated portion corresponding to a problematic pattern (or other selected pattern) within an original packet of data. At 1106, the receiving device determines an initial location within the original packet of data of the problematic pattern (or the other selected pattern). At 1108, the receiving device relocates the problematic pattern (or the other selected pattern) within the decoded data using the initial location to regenerate the original packet of data. Detailed examples of these operations are described above.

Figure 12:
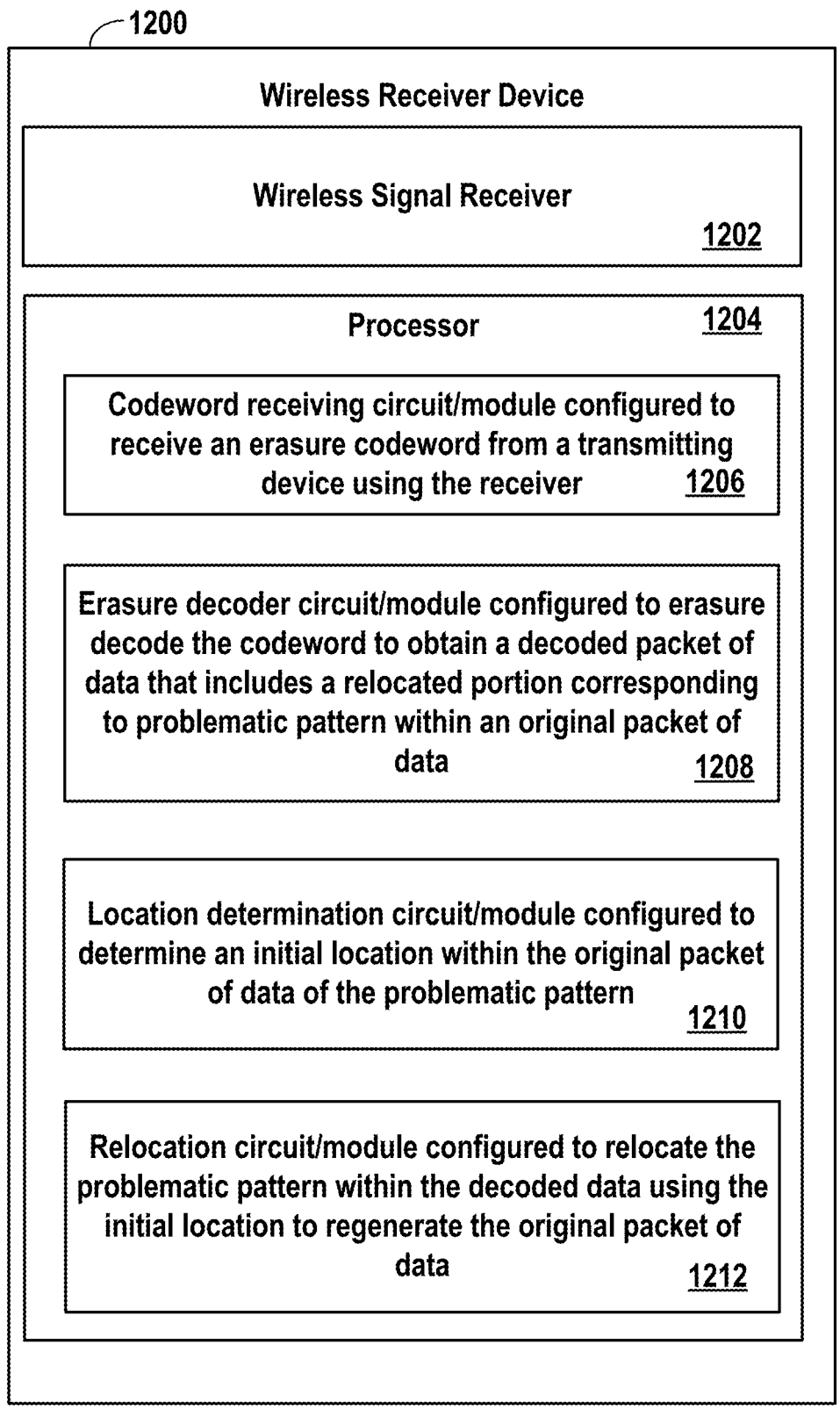
FIG. 12 illustrates selected components of an exemplary wireless receiving device for use in wireless communication.

FIG. 12 illustrates selected components of a wireless receiver device 1200 for use in wireless communication. The receiver device 1200 includes a wireless signal receiver 1202 and a processor 1204 that is communicatively coupled to the receiver 1202. The processor 1204 includes: a codeword receiving circuit/module 1206 configured to receive an erasure codeword from a transmitting device using the receiver 1202; an erasure decoder circuit/module 1208 configured to erasure decode the codeword to obtain a decoded packet of data that includes a relocated portion corresponding to a problematic pattern (or other selected pattern) within an original packet of data; a location determination circuit/module 1210 configured to determine an initial location within the original packet of data of the problematic pattern (or the other selected pattern); and a relocation circuit/module 1212 configured to relocate the problematic pattern (or the other selected pattern) within the decoded data using the initial location to regenerate the original packet of data. Additional or alternative components may be provided.

The codeword receiving circuit/module 1206 provides a means for receiving an erasure codeword from a transmitting device; the erasure decoder circuit/module 1208 provides a means for erasure decoding the codeword to obtain a decoded packet of data that includes a relocated portion corresponding to a problematic pattern (or other selected pattern) within an original packet of data; the location determination circuit/module 1210 provides a means for determining an initial location within the original packet of data of the problematic pattern (or the other selected pattern); and the relocation circuit/module 1212 provides a means for relocating the problematic pattern (or the other selected pattern) within the decoded data using the initial location to regenerate the original packet of data.

As explained above, a wireless device or apparatus may be configured both for (a) erasure encoding and transmitting codewords and for (b) receiving codewords and erasure decoding the codewords. That is, a wireless device may be provided with all of the transmit-side and receive-side components and features shown within FIGS. 1-12.

Figure 13:
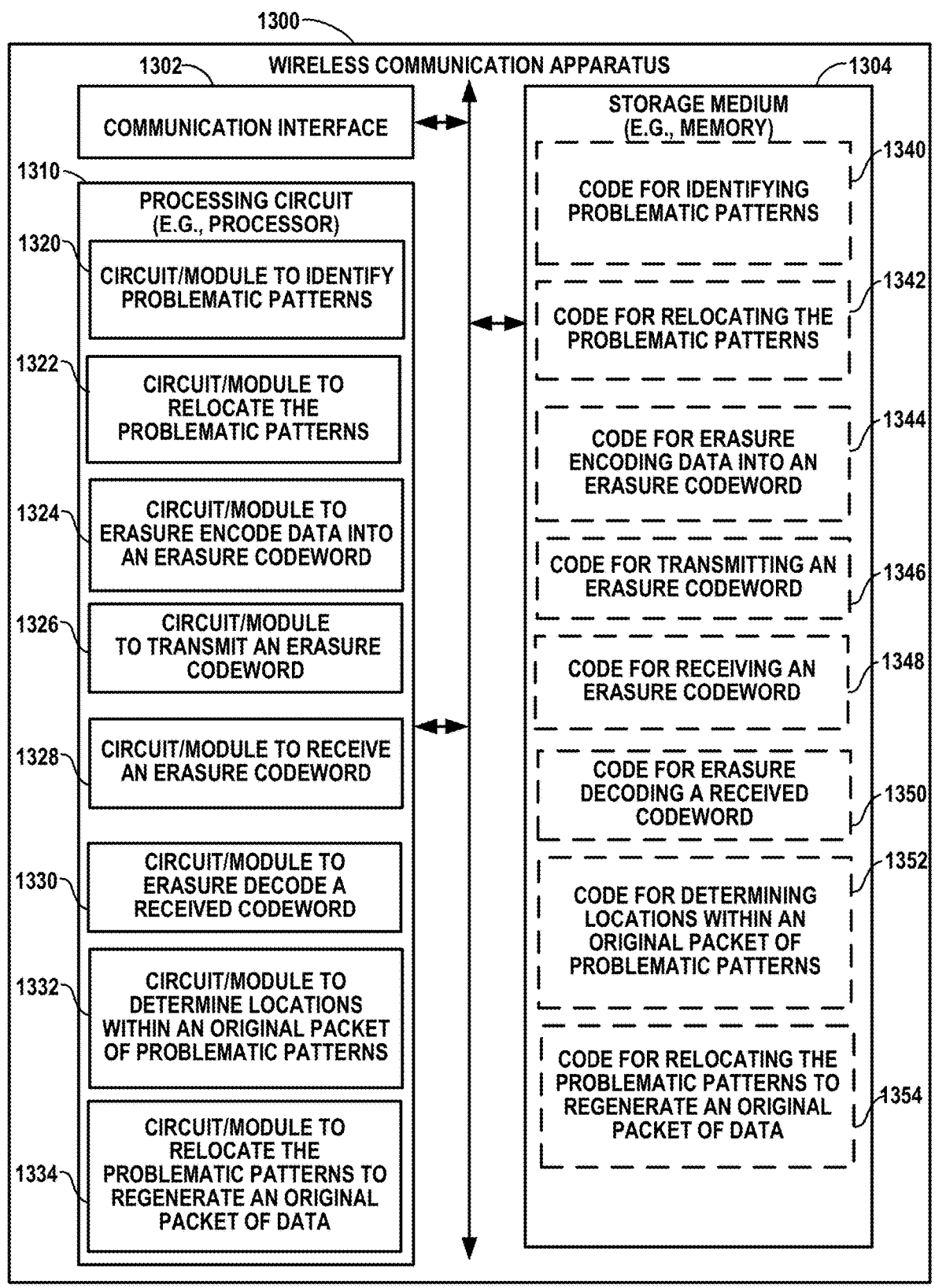
FIG. 13 illustrates selected components of an exemplary wireless device configured for receiving or transmitting signals.

FIG. 13 illustrates an embodiment of a wireless apparatus 1300 configured according to one or more aspects of the disclosure wherein the wireless apparatus 1300 is equipped both for erasure encoding and decoding. The apparatus 1300, or components thereof, could embody or be implemented within any of a variety of devices that support wireless communication, such as servers, smartphones, etc. In various implementations, the apparatus 1300, or components thereof, could embody or be implemented within a computing device, a personal computer, a portable device, or workstation, a server, a personal digital assistant, a digital camera, a digital phone, an entertainment device, a medical device, or any other electronic device that supports wireless communications.

The apparatus 1300 includes a communication interface 1302, a storage medium 1304, and a processing circuit 1310 (e.g., at least one processor and/or other suitable circuitry). These components can be coupled to and/or placed in electrical communication with one another via a signaling bus or other suitable component, represented generally by the connection lines in FIG. 13. The signaling bus may include any number of interconnecting buses and bridges depending on the specific application of the processing circuit 1310 and the overall design constraints. The signaling bus links together various circuits such that each of the communication interface 1302 and the storage medium 1304 are coupled to and/or in electrical communication with the processing circuit 1310. The signaling bus may also link various other circuits (not shown) such as timing sources, peripherals, voltage regulators, and power management circuits, which are well known in the art, and therefore, will not be described any further.

The communication interface 1302 provides a means for communicating with other apparatuses over a wireless transmission medium. In some implementations, the communication interface 1302 includes circuitry and/or programming (e.g., a program) adapted to facilitate the wireless communication of information bi-directionally with respect to one or more devices in a system. The communication interface 1302 serves as one example of a means for receiving and/or a means for transmitting.

The storage medium 1304 may represent one or more computer-readable, machine-readable, and/or processor-readable devices for storing programming, such as processor executable code or instructions (e.g., software, firmware), electronic data, databases, or other digital information. The storage medium 1304 may also be used for storing data that is manipulated by the processing circuit 1310 when executing programming. The storage medium 1304 may be any available media that can be accessed by a general purpose or special purpose processor, including portable or fixed storage devices, optical storage devices, and various other mediums capable of storing, containing or carrying programming.

By way of example and not limitation, the storage medium 1304 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a RAM, ROM, PROM, EPROM, an EEPROM, ReRAM, a register, a removable disk, and any other suitable medium for storing software and/or instructions that may be accessed and read by a computer. The storage medium 1304 may be embodied in an article of manufacture (e.g., a computer program product). By way of example, a computer program product may include a computer-readable medium in packaging materials. In view of the above, in some implementations, the storage medium 1304 may be a non-transitory (e.g., tangible) storage medium. For example, the storage medium 1304 may be a non-transitory computer-readable medium storing computer-executable code, including code to perform operations as described herein.

The storage medium 1304 may be coupled to the processing circuit 1310 such that the processing circuit 1310 can read information from, and write information to, the storage medium 1304. That is, the storage medium 1304 can be coupled to the processing circuit 1310 so that the storage medium 1304 is at least accessible by the processing circuit 1310, including examples where at least one storage medium is integral to the processing circuit 1310 and/or examples where at least one storage medium is separate from the processing circuit 1310 (e.g., resident in the apparatus 1300, external to the apparatus 1300, distributed across multiple entities, etc.).

Programming stored by the storage medium 1304, when executed by the processing circuit 1310, causes the processing circuit 1310 to perform one or more of the various functions and/or process operations described herein. For example, the storage medium 1304 may include operations configured for regulating operations at one or more hardware blocks of the processing circuit 1310, as well as to utilize the communication interface 1302 for wireless communication utilizing their respective communication protocols.

The processing circuit 1310 is generally adapted for processing, including the execution of such programming stored on the storage medium 1304. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 1310 is arranged to obtain, process and/or send data, control data access and storage, issue commands, and control other desired operations. The processing circuit 1310 may include circuitry configured to implement desired programming provided by appropriate media in at least one example. For example, the processing circuit 1310 may be implemented as one or more processors, one or more controllers, and/or other structure configured to execute executable programming. Examples of the processing circuit 1310 may include a general purpose processor, a digital signal processor (DSP), an ASIC, a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 1310 may also be implemented as a combination of computing components, such as a combination of a controller and a microprocessor, a number of microprocessors, one or more microprocessors in conjunction with an ASIC and a microprocessor, or any other number of varying configurations. These examples of the processing circuit 1310 are for illustration and other suitable configurations within the scope of the disclosure are also contemplated.

According to one or more aspects of the disclosure, the processing circuit 1310 may be adapted to perform any or all of the features, processes, functions, operations and/or routines for any or all of the apparatuses described herein. For example, the processing circuit 1310 may be configured to perform any of the steps, functions, and/or processes described with respect to FIGS. 1-12. As used herein, the term "adapted" in relation to the processing circuit 1310 may refer to the processing circuit 1310 being one or more of configured, employed, implemented, and/or programmed to perform a particular process, function, operation and/or routine according to various features described herein. The processing circuit 1310 may be a specialized processor, such as an ASIC that serves as a means for (e.g., structure for) carrying out any one of the operations described in conjunction with FIGS. 1-12. The processing circuit 1310 serves as one example of a means for sending and/or a means for receiving.

According to at least one example of the apparatus 1300, the processing circuit 1310 may include one or more of: a circuit/module 1320 configured to identify problematic patterns in a packet of data to be transmitted; a circuit/module 1322 configured to relocate the problematic patterns from an initial location to an erasure region of the packet to generate a modified packet (which may include selecting the erasure region to correspond to a set or column of overprotected nodes within an H-matrix of an LDPC code); a circuit/module 1324 configured to erasure encode the modified packet into an erasure codeword; a circuit/module 1326 configured to transmit the erasure codeword to a receiving device; a circuit/module 1328 configured to receive an erasure codeword from a transmitting device; a circuit/module 1330 configured to erasure decode the codeword to obtain a decoded packet of data that includes a relocated portion corresponding to problematic patterns within an original packet of data; a circuit/module 1332 configured to determine locations or positions within the original packet of data of the problematic patterns; and a circuit/module 1334 configured to relocate the problematic patterns within the decoded data using the locations to regenerate the original packet of data.

As mentioned above, a program stored by the storage medium 1304, when executed by the processing circuit 1310, causes the processing circuit 1310 to perform one or more of the various functions and/or process operations described herein. For example, the program may cause the processing circuit 1310 to perform the various functions, steps, and/or processes described herein with respect to FIGS. 1-12 in various implementations. As shown in FIG. 13, the storage medium 1304 may include one or more of: code 1340 identifying problematic patterns in a packet of data to be transmitted; code 1342 for relocating the problematic patterns from an initial location to an erasure region of the packet to generate a modified packet (which may include selecting the erasure region to correspond to a set or column of overprotected nodes within an H-matrix of an LDPC code); code 1344 for erasure encoding the modified packet into an erasure codeword; code 1346 for transmitting the erasure codeword to a receiving device; code 1348 for receiving an erasure codeword from a transmitting device; code 1350 for erasure decoding the codeword to obtain a decoded packet of data that includes a relocated portion corresponding to problematic patterns within an original packet of data; code 1352 for determining locations or positions within the original packet of data of the problematic patterns; and code 1354 for relocating the problematic patterns within the decoded data using the locations to regenerate the original packet of data.

Although described herein with reference to wireless signal transmissions (e.g. radio transmissions in accordance with long term evolution (LTE), 4G, 5G, etc.), aspects of the disclosure may also be applied to optical transmissions. Also, although described with reference to examples using a uniform LDPC matrix, aspects of the disclosure may be applied to coding schemes using non-uniform matrices. Still further, as noted above, the pattern to be relocated need not be a problematic pattern but can be some other pattern selected for another reason.

Additional Aspects

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," and variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" is intended to cover A, B, C, A-B, A-C, B-C, and A-B-C, as well as multiples of the same members (e.g., any lists that include AA, BB, or CC). Likewise, "at least one of: A, B, and C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A device for wireless communication, the device comprising:
   a wireless signal transmitter; and
   a processor communicatively coupled to the transmitter, the processor configured to:
     identify at least one symbol in a packet of data to be transmitted;
     determine an erasure region in the packet of data, wherein the erasure region corresponds to a puncturing pattern that prevents symbols in the erasure region from being transmitted;

relocate the at least one symbol from an initial location in the packet to the erasure region in the packet to generate a modified packet;

erasure encode the modified packet into an erasure codeword configured to overprotect the erasure region; and transmit the erasure codeword to a receiving device using the transmitter.

2. The device of claim 1, wherein the processor is further configured to erasure encode the modified packet by generating a low-density parity-check (LDPC) codeword.

3. The device of claim 2, wherein the processor is further configured to puncture the erasure region of the LDPC codeword before transmitting the erasure codeword.

4. The device of claim 1, wherein the processor is further configured to select the erasure region to correspond to a set of overprotected nodes within an H-matrix of an LDPC code.

5. The device of claim 1, wherein the processor is further configured to:
generate location data identifying the initial location of the at least one symbol in the packet of data; and
append the location data to the packet of data before encoding.

6. The device of claim 1, wherein the processor is further configured to erasure encode the modified packet into the erasure codeword by generating a parity block codeword over a plurality of sub-block codewords corresponding to the modified packet.

7. The device of claim 6, wherein the processor is further configured to erasure encode the modified packet so that each sub-block codeword is a low-density parity-check (LDPC) codeword.

8. The device of claim 1, wherein the processor is further configured to identify the at least one symbol by identifying a problematic pattern in the at least one symbol that causes unintended erasures within transmitted messages.

9. A method for use by a device for wireless communication, the method comprising:
identifying at least one symbol in a packet of data to be transmitted;
determining an erasure region in the packet of data, wherein the erasure region corresponds to a puncturing pattern that prevents symbols in the erasure region from being transmitted;
relocating the at least one symbol from an initial location in the packet to the erasure region in the packet to generate a modified packet;
erasure encoding the modified packet into an erasure codeword configured to overprotect the erasure region; and
transmitting the erasure codeword to a receiving device.

10. The method of claim 9, wherein the modified packet is erasure encoded by generating a low-density parity-check (LDPC) codeword.

11. The method of claim 10, further comprising puncturing the erasure region of the LDPC codeword before transmitting the erasure codeword.

12. The method of claim 9, further comprising:
generating location data identifying the initial location of the at least one symbol in the packet of data; and
appending the location data to the packet before encoding.

13. The method of claim 9, wherein the at least one symbol includes is a problematic pattern that causes unintended erasures within transmitted messages.

14. A device for wireless communication, the device comprising:
a wireless signal receiver; and
a processor communicatively coupled to the receiver, the processor configured to:
receive an erasure codeword from a transmitting device using the receiver, wherein the erasure codeword includes a punctured erasure region in a predetermined location in the erasure codeword;
erasure decode the erasure codeword to obtain a decoded packet of data, wherein:
the erasure decoding includes restoring the punctured erasure region; and
the punctured erasure region includes a relocated portion corresponding to at least one relocated symbol from an original packet of data;
determine an initial location in the original packet of data of the at least one relocated symbol; and
relocate the at least one relocated symbol in the decoded packet of data using the initial location to regenerate the original packet of data.

15. The device of claim 14, wherein the processor is further configured to receive the erasure codeword as a punctured low-density parity-check (LDPC) codeword.

16. The device of claim 14, wherein the processor is further configured to:
decode location data within the erasure codeword; and
determine the initial location in the original packet of data of the at least one relocated symbol using the location data.

17. The device of claim 14, wherein the processor is further configured to relocate the at least one relocated symbol to its initial location by overwriting any other patterns at the initial location.

18. The device of claim 14, wherein the processor is further configured to erasure decode the received codeword by decoding the received codeword as a parity block codeword over a plurality of sub-block codewords.

19. The device of claim 18, wherein each sub-block codeword is a low-density parity-check (LDPC) codeword.

20. The device of claim 14, wherein the at least one relocated symbol in the original packet of data includes a problematic pattern that causes unintended erasures within transmitted messages.

21. A method for use by a device for wireless communication, the method comprising:
receiving an erasure codeword from a transmitting device wherein the erasure codeword includes a punctured erasure region in a predetermined location in the erasure codeword;
erasure decoding the erasure codeword to obtain a decoded packet of data, wherein:
the erasure decoding includes restoring the punctured erasure region; and
the punctured erasure region includes a relocated portion corresponding to at least one relocated symbol from an original packet of data;
determining an initial location in the original packet of data of the at least one relocated symbol; and
relocating the at least one relocated symbol in the decoded packet of data using the initial location to regenerate the original packet of data.

22. The method of claim 21, wherein the erasure codeword is a punctured low-density parity-check (LDPC) codeword.

23. The method of claim 22, further comprising:
receiving location data within the erasure codeword; and
determining the initial location in the original packet of data of the at least one relocated symbol using the location data.

24. The method of claim 21, wherein the at least one relocated symbol includes is a problematic pattern that causes unintended erasures within transmitted messages.

* * * * *